(12) United States Patent
Herman et al.

(10) Patent No.: US 8,143,616 B2
(45) Date of Patent: Mar. 27, 2012

(54) MAKING A STRUCTURE

(75) Inventors: Gregory S. Herman, Albany, OR (US);
Peter Mardilovich, Corvallis, OR (US);
Chinmay Betrabet, Corvallis, OR (US);
Chih-hung Chang, Corvallis, OR (US);
Yu-jen Chang, Corvallis, OR (US);
Doo-Hyoung Lee, Corvallis, OR (US);
Mark W. Hoskins, Corvallis, OR (US)

(73) Assignees: Oregon State University, Corvallis, OR (US); Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/426,955

(22) Filed: Apr. 20, 2009

(65) Prior Publication Data

US 2009/0200541 A1 Aug. 13, 2009

Related U.S. Application Data

(62) Division of application No. 10/885,223, filed on Jul. 6, 2004, now Pat. No. 7,547,647.

(51) Int. Cl.
*H01L 29/06* (2006.01)
*H01L 21/02* (2006.01)

(52) U.S. Cl. .................. 257/24; 257/410; 257/E21.065; 257/E29.168; 977/938

(58) Field of Classification Search ............... 257/410, 257/411, E21.065, E23.177, 24, E29.168; 977/938
See application file for complete search history.

(56) References Cited

U.S. PATENT DOCUMENTS

| | | | |
|---|---|---|---|
| 4,147,911 A | 4/1979 | Nishitani | |
| 4,490,183 A | 12/1984 | Scovell | |
| 4,504,518 A | 3/1985 | Ovshinsky et al. | |
| 4,521,447 A | 6/1985 | Ovshinsky et al. | |
| 4,585,699 A | 4/1986 | Berteaud et al. | |
| 4,701,345 A | 10/1987 | Giaatras et al. | |
| 4,943,316 A | 7/1990 | Taylor | |
| 5,066,475 A * | 11/1991 | Yoshinaka et al. | ............ 423/622 |
| 5,132,248 A | 7/1992 | Drummond et al. | |
| 5,156,986 A | 10/1992 | Wei et al. | |
| 5,220,346 A | 6/1993 | Carreira et al. | |
| 5,227,600 A | 7/1993 | Blake et al. | |
| 5,238,710 A | 8/1993 | Ahmad et al. | |
| 5,317,081 A | 5/1994 | Gelorme et al. | |
| 5,431,966 A | 7/1995 | Daude et al. | |
| 5,481,428 A | 1/1996 | Lauf et al. | |
| 5,662,734 A | 9/1997 | Crystal | |
| 5,693,129 A | 12/1997 | Lin | |
| 5,796,079 A | 8/1998 | Kim et al. | |
| 5,847,355 A | 12/1998 | Barmatz et al. | |
| 5,879,756 A | 3/1999 | Fathi et al. | |

(Continued)

FOREIGN PATENT DOCUMENTS

EP 0 484 808 5/1992

(Continued)

OTHER PUBLICATIONS

Schroeder et al., "Energy level alignment and two-dimensional structure of pentacene on Au(111) surfaces", Mar. 1, 2002, Journal of Applied Physics, vol. 91, No. 5, pp. 3010-3014.*

(Continued)

*Primary Examiner* — Lex Malsawma

(57) ABSTRACT

A structure includes a surface and a non-equilibrium two-dimensional semiconductor micro structure on the surface.

20 Claims, 15 Drawing Sheets

U.S. PATENT DOCUMENTS

| | | | |
|---|---|---|---|
| 5,883,349 | A | 3/1999 | Kingston |
| 6,078,035 | A | 6/2000 | Chittipeddi et al. |
| 6,086,826 | A | 7/2000 | Thomas et al. |
| 6,104,015 | A | 8/2000 | Jayan et al. |
| 6,340,225 | B1 | 1/2002 | Szlucha |
| 6,384,390 | B1 | 5/2002 | Jung et al. |
| 6,425,663 | B1 | 7/2002 | Eastlund et al. |
| 6,444,964 | B1 | 9/2002 | Eastlund et al. |
| 6,483,124 | B2 | 11/2002 | Flewitt |
| 6,503,831 | B2 * | 1/2003 | Speakman ............ 438/674 |
| 6,508,550 | B1 | 1/2003 | Eastlund et al. |
| 6,512,216 | B2 | 1/2003 | Gedevanishvili et al. |
| 6,599,582 | B2 | 7/2003 | Kiguchi et al. |
| 6,835,608 | B2 | 12/2004 | Jang et al. |
| 6,838,308 | B2 * | 1/2005 | Haga ............ 438/104 |
| 6,849,308 | B1 | 2/2005 | Speakman et al. |
| 2002/0084465 | A1 | 7/2002 | Green et al. |
| 2003/0083203 | A1 | 5/2003 | Hashimoto et al. |
| 2003/0157250 | A1 | 8/2003 | Mukherjee |
| 2005/0009224 | A1 * | 1/2005 | Yang et al. .......... 438/57 |

FOREIGN PATENT DOCUMENTS

| | | |
|---|---|---|
| JP | 61-235835 | 10/1986 |
| JP | 5-270047 | 10/1993 |
| JP | 5-278259 | 10/1993 |
| JP | 10-146978 | 6/1998 |
| JP | 11-340129 | 12/1999 |
| JP | 20030038324 | 9/2004 |
| WO | WO 2004/111298 | 12/2004 |

OTHER PUBLICATIONS

Peiro; "Titanium (IV) oxide thin films obtained by a two-step soft solution method"; Preparation and Characterization, vol. 411, No. 2, May 31, 2002; pp. 185-191.

Johnson, R. Colin, Conductive plastic could speed electronics manufacturing, Apr. 14, 2004, EE Times, 3 pages.

Zhang, Shengdong et al., A Viable Self-Aligned Bottom-Gate MOS Transistor Technology for Deep Submicron 3-D SRAM, Sep. 2003, pp. 1952-1960, IEEE Transactions on Electron Devices, vol. 50, No. 9.

Peiro, Ana, et al. Titanium(IV) Oxide Thin Films Obtained by a Two-Step Soft-Solution Method. Thin Solid Films 411 (2002) 185-191. Jul. 20, 2001.

* cited by examiner

MAKING A STRUCTURE

CROSS-REFERENCE TO RELATED PATENT APPLICATION

The present application is a divisional application filed under 37 C.F.R. 1.53(b) and claims priority from co-pending U.S. application Ser. No. 10/885,223 filed on Jul. 6, 2004 and entitled METHOD OF MAKING A STRUCTURE by Gregory S. Herman, Peter Mardilovich, Chinmay Betrabet, Chih-hung Chang, Yu-jen Chang, Doo-Hyoung Lee, and Mark W. Hoskins, the full disclosure of which is hereby incorporated by reference.

BACKGROUND

There has been a continuous drive towards forming electronic and optical devices on inexpensive flexible substrates such as glass, metal, and/or plastics. Such technology has resulted in electronic devices using functional organic materials, however such materials have sever limitations in their expected performance characteristics. Processing of inorganic materials that are compatible with inexpensive substrates involves control over the local heating that can also influence the size and shape of the resulting materials. The current formation or manufacturing techniques do not achieve adequate control to form these higher performance inorganic materials on flexible substrates.

DETAILED DESCRIPTION OF EXAMPLE EMBODIMENTS

Figure 1:
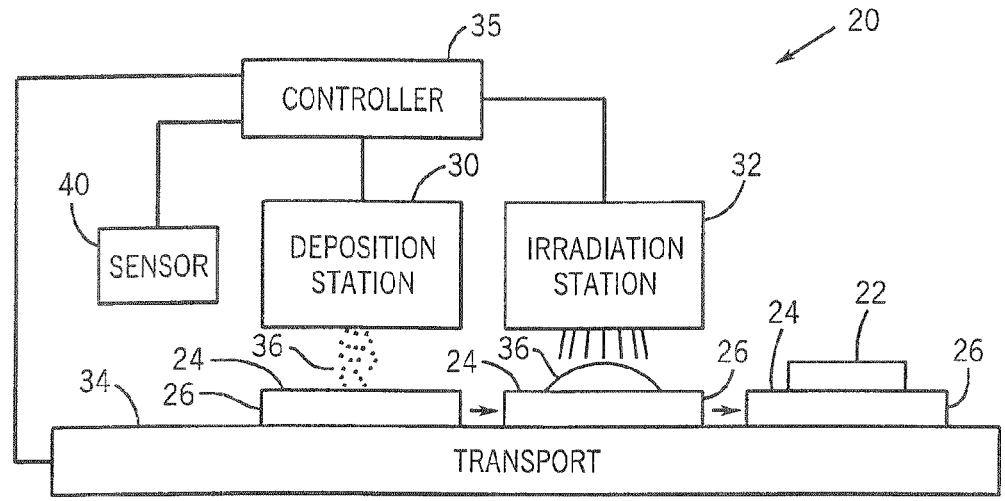
FIG. 1 is a schematic illustration of an embodiment of a structure forming system according to one example embodiment of the present invention.

FIG. 1 is a schematic illustration of an embodiment of a structure forming system 20 configured to form a micro structure 22 comprising non-equilibrium two-dimensional crystals on a support or substrate 26. System 20 generally includes deposition station 30, irradiation station 32, transport 34 and controller 35. Deposition station 30 comprises one or more mechanisms configured to deposit or otherwise apply a liquid precursor solution 36 upon surface 24 of substrate 26. The precursor solution generally comprises a solvent in which a solute is dissolved. Deposition station 30 deposits solution 36 upon surface 24 in desired locations or in a desired pattern.

In one embodiment, deposition station 30 includes one or more nozzles through which solution 36 is ejected onto surface 24. In one particular embodiment, deposition station 30 includes one or more print heads, such as inkjet print heads, configured to deposit drops of solution 30 in relatively fine amounts at precisely controlled locations upon surface 24. In one particular embodiment, deposition station 30 comprises an ink-jet printer configured to deposit solution 36 upon surface 24 in micro-, nano-, pico-, and/or femto-liter drops. Because solution 36 may be deposited in quantities no greater than nano-liter drops, solution 36 may be precisely deposited upon substrate 26. This precision is increased as the drop size is reduced. Such an ink-jet printer may utilize one or more print heads which are movable along a scan axis by a carriage or which are fixed or stationary. Such an ink-jet printer may utilize cartridges containing the supply of solution 36 or may be supplied with solution 36 from an external supply and pump, commonly referred to as an off-axis supply system. The use of an ink-jet printer or ink-jet print heads enables deposition station 30 to precisely place precursor drops of solution 36 in various amounts for direct patterning of micro structure 22 upon surface 24. As a result, the location, size, quantity and thickness of micro structure 22 formed from solution 36 may also be precisely controlled. For example, micro structure 22 may be provided with a relatively small thickness with the additional ability of patterning. In other embodiments, deposition station 30 may comprise other devices configured to eject, deposit or otherwise apply a fluid precursor solution 36 upon surface 24 of a substrate 26 or into (i.e., between) more than one surfaces 24 of substrate 213. Examples of other methods by which liquid precursor solution 36 may be deposited upon substrate 26 include spin coating, dip coating, condensation, chemical solution deposition, spray and transfer methods, micro-dispenser deposition, and the like.

Irradiation station 32 generally comprises a device configured to irradiate precursor solution 36 after pre-cursor solution 36 has been deposited upon surface 24. Irradiation station 32 is specifically configured to apply microwaves to precursor solution 36.

Transport 34 comprises one or more devices configured to move substrate 26 relative to deposition station 30 and irradiation station 32. In one particular embodiment, transport 34 may comprise a conveyor system. In another embodiment, transport 34 may comprise a series of belts, pulleys, rollers and the like which engage opposite sides of substrate 26 to move substrate 26 relative to deposition station 30 and irradiation station 32. In one embodiment, transport 34 may be generally located external to deposition station 30 and irradiation station 32. In another embodiment, transport 34 may be formed within and extend through deposition station 30 and/or irradiation station 32. In still other embodiments, transport 34 may be omitted, wherein substrate 26 is manually moved between deposition station 30 and irradiation station 32.

Controller 35 generally comprises a processing unit configured to generate control signals and direct the operation of deposition station and irradiation station 32. In the particular embodiment illustrated, controller 35 further generates control signals which direct the operation of transport 34. For purposes of this disclosure, the term "processing unit" shall mean any processing unit (including those that may be developed in the future) that executes sequences of instructions contained in a memory. Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other embodiments, hard wired circuitry may be used in place of or in combination with software instructions to implement the functions described. Controller 35 is not limited to any specific combination of hardware circuitry and software, nor to any particular source for the instructions executed by the processing unit.

According to one embodiment, controller 35 generates control signals which cause deposition station 30 to deposit or apply precursor solution 36 at a predetermined resolution or density and in a predetermined pattern or arrangement upon surface 24 of substrate 26. In one embodiment, system 20 may additionally include a sensor 40 configured to sense the characteristics of substrate 26. The sensed characteristics of substrate 26 (represented by electrical signals) are transmitted to controller 35 which generates control signals for the direction of deposition station 30 and irradiation station 32 based upon such sensed characteristics of substrate 26. For example, controller 35 may generate control signals adjusting or tuning the frequency of a microwave being applied to substrate 26 based upon the characteristics of substrate 26 such that substrate 26 will not significantly absorb the energy from the microwaves but such that solution 36 will absorb a sufficient amount of energy from the microwave to crystallize its solute upon substrate 26. In other embodiments, sensor 40 may be omitted, such as when the characteristics of substrate 26 are otherwise input to controller 35 or wherein controller 35 is specifically configured for use with a particular predetermined type of substrate 26.

Controller 35 further generates control signals which direct irradiation station 32 to irradiate precursor solution 36 upon substrate 26. Controller 35 generates such control signals which cause irradiation station 32 to vary the time, power and/or frequency of the microwaves applied to precursor solution 36. The time, power and frequency of the microwaves applied by radiation station 32 to precursor solution 36 causes the solute within precursor solution 36 to crystallize upon or within substrate 26 as two-dimensional non-equilibrium crystals that form micro structure 22. The remaining solvent of solution 36 is either vaporized or otherwise removed (such as by rinsing, filtering, vacuuming and the like) from substrate 26. The resulting micro structure 22 comprises a thin film of the solute upon surface 24, thus providing a simple and low-cost micro and nano fabrication technique.

Figure 2A:
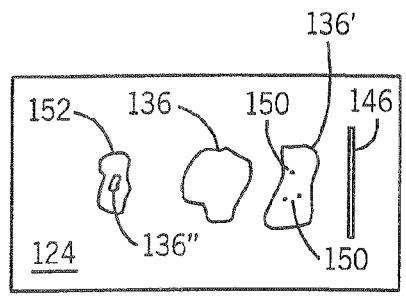
FIG. 2a is a top plan view of exemplary liquid precursor solutions upon a first substrate according to one exemplary embodiment.
Figure 2B:
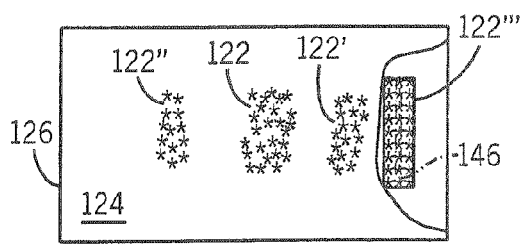
FIG. 2b is a top plan view of exemplary crystalline micro structures on the first substrate of FIG. 2a according to one exemplary embodiment.
Figure 3A:
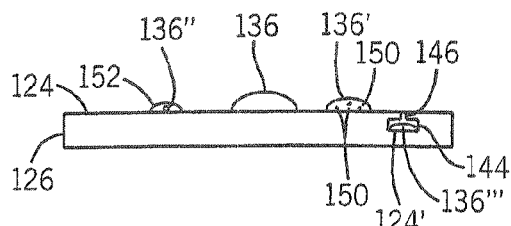
FIG. 3a is a sectional view of the solutions and first substrate of FIG. 2a according to one exemplary embodiment.

FIGS. 2a, 2b, 3a and 3b schematically illustrate the formation of micro structures 122, 122', 122" and 122''', examples of micro structure 22 (shown in FIG. 1), upon substrate 126. As shown by FIGS. 2a and 3a, controller 35 (shown in FIG. 1) generates control signals which cause transport 34 to position substrate 126 proximate to deposition station 30. Controller 35 further generates control signals which cause deposition station 30 to deposit precursor solutions 136, 136' and 136" upon surface 24 of substrate 26 and to deposit precursor solution 136''' onto an interior surface 124' formed within a cavity 144 within substrate 126 via port 146.

Substrate 126 is similar to substrate 26 in that substrate 126 comprises a support structure configured to support one or more precursor solutions being deposited upon it. In one embodiment, substrate 126 is formed from one or more materials that do not interact strongly with microwave radiation, enabling crystallization of precursor solutions 136, 136', 136" and 136''' without substantial heating of substrate 126. Examples of such materials from which substrate 126 may be formed include polydimethylsiloxane (PDMS), polyethyleneteraphalate (PET), KAPTON polyimide film by Dupont, glass, etc.

Substrate 126 includes an exterior surface 124 as well as an interior surface 124'. Interior surface 124' is formed by an interior cavity 144 within substrate 126. Access to the internal cavity 144 is provided by port 146. Substrate 126 is generally formed from an imperforate and generally impermeable material. In other embodiments, substrate 126 may alternatively be formed from a perforated material or a permeable, absorbent material. In lieu of having an internal cavity 144 providing interior surface 124', substrate 126 may have multiple open or closed celled pores each providing an interior surface 124'. In still other embodiments, interior surface 124' may be defined between adjacent segments or sections of substrate 126 which are held together.

Precursor solution 136 generally comprises a solution including a first solvent in which a first solute is dissolved. Precursor solution 136' comprises a solution including a second solvent in which a second solute is dissolved. The second solvent and/or the second solute may be the same as or different than the first solvent and the first solute, respectively. Precursor solution 136' additionally includes one or more nano-crystals 150 within the solvent of solution 136'. Nano-crystals 150 have a specific symmetry or shape to serve as centers for crystallization of the solute of solution 136'. By providing nano-crystals 150 with a specific symmetry and shape within solution 136', the configuration of micro structure 122 may also be varied as well as controlled.

In one particular embodiment, the first solvent has a different viscosity as compared to the second solvent. The different viscosities of the first solvent and the second solvent cause the first solute and the second solute to diffuse differently. As a result, the first solute and the second solute form distinctly configured crystals upon being irradiated which further results in control and variation of micro structure 122.

Precursor solution 136" comprises a liquid solution including a third solvent in which a third solute is dissolved. The third solvent and the third solute may be the same as or distinct from the first and second solvents as well as the first and second solutes. Unlike precursor solutions 136 and 136', precursor solution 136" is formed as an emulsion. In particular, precursor solution 136" comprises a micelle that is suspended within an outer liquid 152. For example, in one embodiment, precursor solution 136" may be oil or other surfactants while liquid 152 is aqueous based. Liquid 152 controls the volume of the emulsion comprising precursor solution 136' such that the shape or form of the crystallized solute which forms micro structure 122 is also controlled or shaped. In other embodiments, solution 136" may be in the form of a reverse micelle. For example, precursor solution 136" may be aqueous-based while liquid 152 is an oil.

Precursor solution 136''' is deposited upon interior surface 124' of substrate 126. Precursor solution 136''' is similar to precursor solution 136. Upon being irradiated, precursor solution 136''' forms micro structure 122''' upon surface 124'. In other embodiments, precursor solution 136''' may alternatively be similar to precursor solution 136' or precursor solution 136". In lieu of being deposited upon surface 124' through port 146, precursor solution 136''' may be applied to surface 124' of a separate substrate portion or segment which is then held adjacent to a first substrate portion providing surface 124. In other embodiments, precursor solution 136''' may be absorbed into substrate 126 or injected into one or more internal cavities (sometimes in the form of pores) of substrate 126.

Figure 3B:
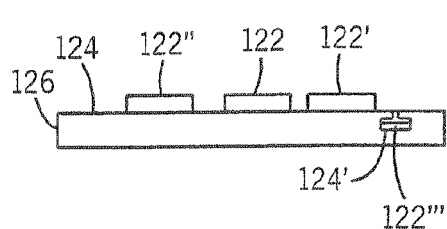
FIG. 3b is a sectional view of the micro structures and first substrate of FIG. 2b according to one exemplary embodiment.

As shown by FIGS. 2b and 3b, controller 35 (shown in FIG. 1) generates control signals which cause transport 34 to position substrate 126 proximate to irradiation station 32 (shown in FIG. 1). Controller 35 further generates control signals which cause irradiation station 32 to irradiate solutions 136, 136', 136" and 136''' with microwaves. The interaction of microwaves with precursor solutions 136, 136', 136" and 136''' provides energy to the material of the solutes with dipole rotation and/or ionic conduction. The microwaves provide increased kinetic energy to the solutes which results in rapid heat gain. This heat gain activates specific reactions related to film growth. With some solutes, the formation of micro structures is difficult without the application of microwaves to disassociate one of the reactants (i.e., solute). In some applications, film formation kinetics is increased by an order of magnitude or more.

Overall, the application of microwave energy to precursor solution initiates rapid thin-film formation to form micro structures 122, 122', 122" and 122'''. In the particular embodiment illustrated in which deposition station 30 deposits precursor solutions 136, 136', 136" and 136''' using an ink-jet printhead, precise placement of precursor solution drops is facilitated for direct patterning of thin films upon substrate 126. The application of microwaves to precursor solutions 136, 136', 136" and 136''' further enables the synthesis of new materials with unique non-equilibrium crystals. Because microwaves are used to crystallize solute within precursor solutions 136, 136', 136" and 136''' typical sintering temperatures are lowered, allowing a variety of different substrates, including flexible polymeric materials, to be utilized. Because microwave energy primarily acts with precursor solution 136, 136', 136" and 136''' that form micro structures 122, 122', 122" and 122''', the entire system, i.e., substrate 126 and possibly other components or structures upon substrate 126, may not be substantially heated. In addition, because the process enables the formation of two-dimensional films, less materials, such as semiconducting materials, are used to produce a continuous functional film.

Figure 4:
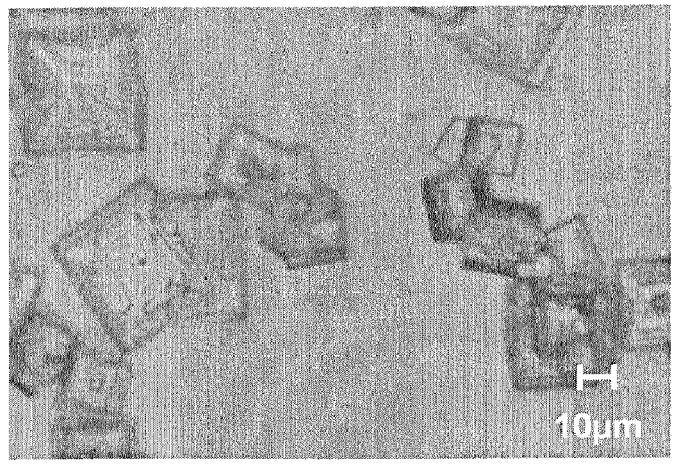
FIG. 4 is an optical micrograph of crystals formed from an exemplary first solution that has undergone thermal evaporation.

FIG. 4 is an optical micrograph illustrating crystal morphology of a thermal processed 1M NaCl solution. The NaCl solution illustrated has undergone thermal evaporation (air dry) which results in equilibrium crystals in the form of cubic crystals. In contrast, FIGS. 5a and 5b illustrate the same 1 M NaCl solution which has been irradiated by irradiation station 32 (shown in FIG. 1) to produce two-dimensional non-equilibrium crystals which form micro structure 222'.

Figure 5A:
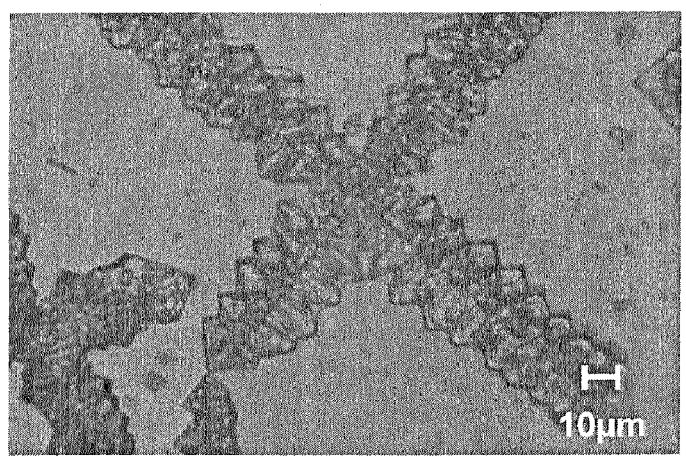
FIGS. 5a and 5b are optical micrographs of crystals formed from the first solution of FIG. 4 that have been irradiated with microwaves according to one exemplary embodiment.
Figure 5B:
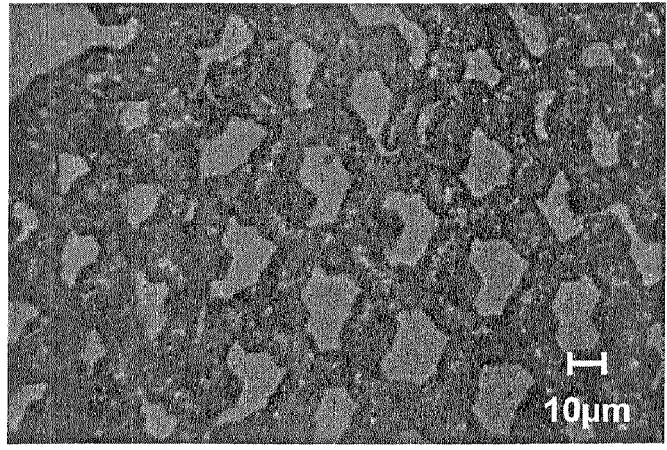

The micro structures shown in FIGS. 5a and 5b were formed by printing the 1 M NaCl precursor solution at a first resolution (i.e. density) and with a second greater resolution, respectively, and irradiating the solutions with microwaves having a power of 1580 watts and a frequency of 2450 MHz for a time period of 2 minutes. As shown by FIGS. 5a and 5b, the resulting thin film micro structures 222' have an enhanced crystallinity as compared at the equilibrium micro structure shown in FIG. 4. The increased crystallinity or complexity of the resulting micro structures results in the individual crystals being interconnected, providing continuous thin-film functionality. The enhanced crystallinity of micro structures 222' enables micro structures 222' to provide a continuous thin film which has benefits in several applications as will be described hereafter. The two-dimensionality of micro structures 222' also enables micro structures 222' to have a reduced thickness and to use less material.

Figure 6A:
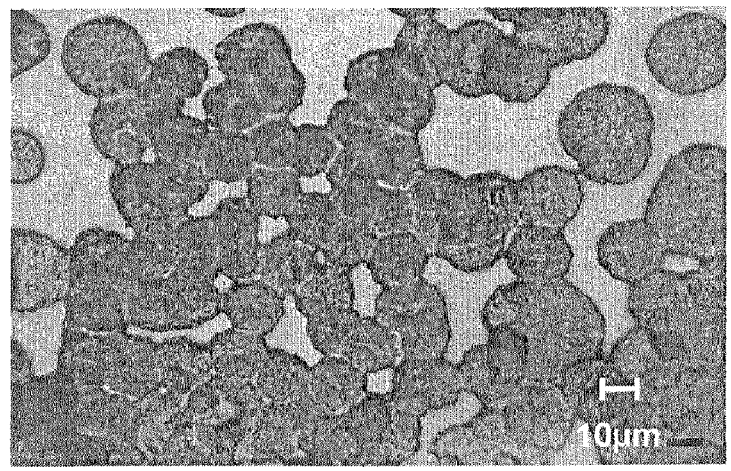
FIGS. 6a and 6b are optical micrographs of crystals formed by irradiating an exemplary second solution with microwaves according to one exemplary embodiment.
Figure 6B:
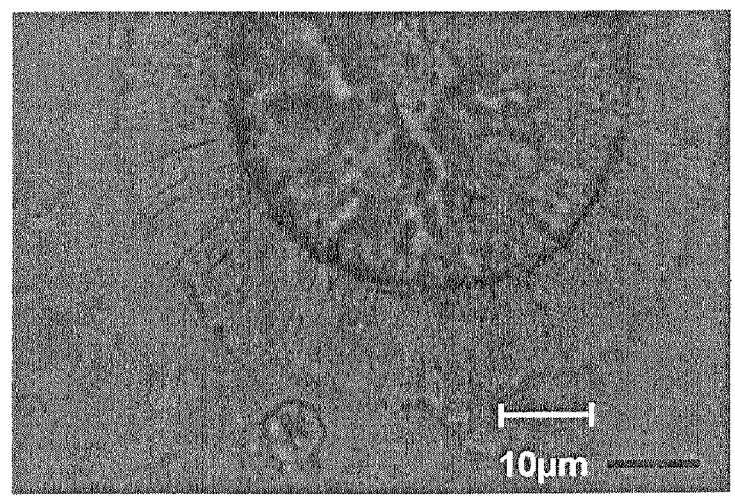
Figure 7A:
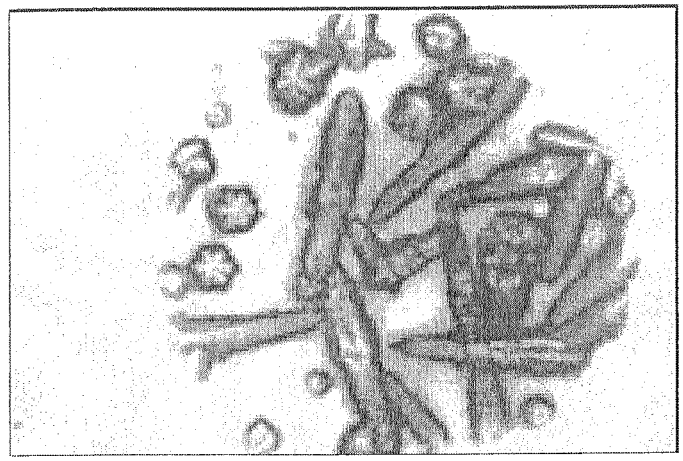
FIGS. 7a-7f are optical micrographs of crystalline micro structures formed by irradiating an exemplary third solution for different time periods according to one exemplary embodiment.
Figure 7B:
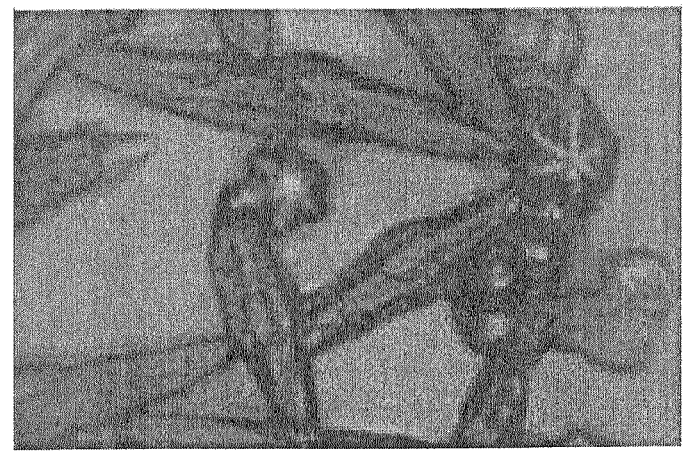
Figure 7C:
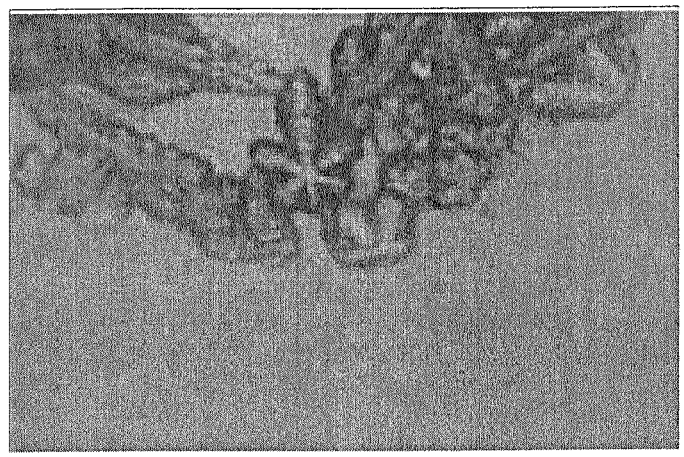
Figure 7D:
Figure 7D:
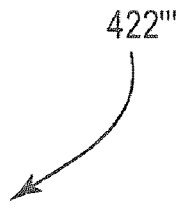
Figure 7E:
Figure 7E:
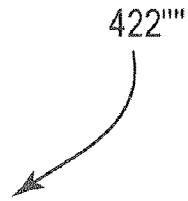
Figure 7F:
Figure 7F:
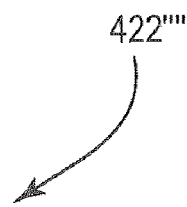

FIGS. 6a and 6b are optical micrographs illustrating crystallization of solute from a 0.5 M $Zn(NO_3)_2$ precursor solution after being irradiated by irradiation station 32 (shown in FIG. 1). In particular, the precursor solution comprises $Zn(NO_3)_2 \cdot xH_2O$ (1.89 g)+DI–water (20 ml). The crystals shown in FIG. 6A were formed from the solution printed at a first resolution while the crystals shown in FIG. 6B were formed from a solution printed at a second lesser resolution. Once the solutions were printed, irradiation station 32 applied microwave energy at a power level of 1580 watts, at a frequency of 2450 MHz for a period of 9 minutes. As shown by FIGS. 6a and 6b, the resulting micro structures 322 provides a thin film structure formed from non-equilibrium two-dimensional crystals.

In addition to the NaCl solution and the $Zn(NO_3)_2$ solution which have been irradiated as shown in FIGS. 4, 5a, 5b and 6a and 6b, various other precursor solutions may also be irradiated to crystallize solute to form a non-equilibrium two-dimensional crystals and micro structures. For example, to date, the following reactions have been observed by irradiating various precursor solutions:

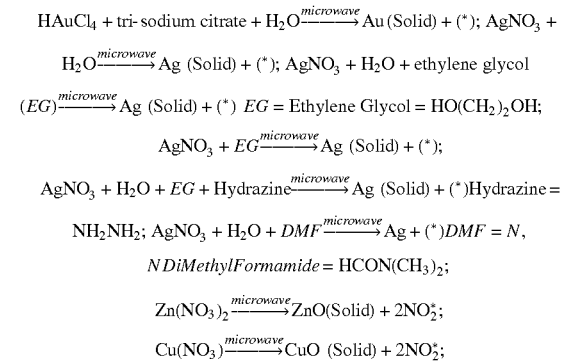

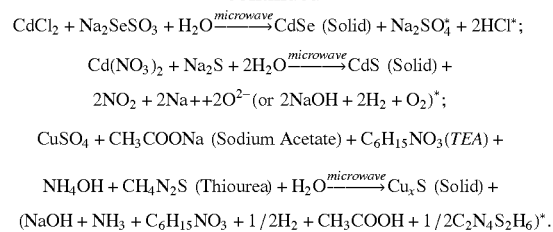

The "*" generally indicates that the remaining elements of the solution after irradiation are either washable or vaporizable. Due to similar properties, it is believed that the following solutions: Metal Nitrates (e.g. $AgNO_3$, $Al(NO_3)_3$, $Ba(NO_3)_2$, $Bi(NO_3)_3$, $Cd(NO_3)_2$, $Cu(NO_3)$, $Fe(NO_3)_2$, $In(NO_3)_3$, $Mg(NO_3)_2$, $Mn(NO_3)_2$, $Pb(NO_3)_2$, $Y(NO_3)_3$, $Zn(NO_3)_2$, Metal Halides (e.g. $HAuCl_4$, $H_2PtCl_4$, $H_2PdCl_4$, $BiCl_3$, $CoCl_2$, $CuCl_2$, $CuCl$, $CdCl_2$, $CdI$, $HgCl_2$, $InCl_3$, $MgCl_2$, $SnCl_2$, $SnCl_4$, $TiCl_4$, $ZrCl_2$) Metal Sulfates (e.g. $CdSO_4$, $CuSO_4$, $MgSO_4$, $PbSO_4$, $ZnSO_4$), Metal Acetate (Cd $(CH_3COO)_2$, $Mg(CH_3COO)_2$, $Pb(CH_3, COO)_2$, $Zn(CH_3COO)_2$), oxidizing agents (e.g. persulfate, urea, dimethylaminoborane, $NaNO_2$, $H_2O_2$), sulfur sources (e.g. $Na_2S$, thiourea, thioacetamide, allylthiourea, ethylthiourea, thiosemicarbazide, $Na_2S_2O_3$), selenium source (e.g. $Na_2Se$, selenourea, $Na_2SeSO_3$, dimethylselenourea), complex and reducing agents ($NH_4OH$, tri-sodium citrate, hydrazine, ethyleneglycol, dimethylformamide, triethanolamine, triethyleneamine, ethylenediamine, nitrilotriacetate) and solvents may be used and the following solutes: Ag, Au, Pd, Pt, Oxides (e.g. AgO, $Al_2O_3$, CdO, CuO, $Fe_2O_3$, $Fe_3O_4$, $In_2O_3$, MgO, $Mn_2O_3$, $MnO_2$, NiO, $PbO_2$, $SnO2$, $TiO_2$, $Y_2O_3$, ZnO, $ZrO_2$, $BaTiO_3$, $Cd_2SnO_4$, CdZnO, $CuAlO_2$, $MgAl_2O_4$, $YBaCu_3O_7$, $Mn_xZr_{1-x}Fe_2O_4$, $CuFe_2O_4$); Selenides (e.g. Se, CdSe, $Bi_2Se_3$, CoSe, CuSe, HgSe, PbSe, SnSe, $Sb_2Se_3$, ZnSe, CdZnSe, PbHgSe, $CuInSe_2$, etc.) and Sulfides (e.g. $Ag_2S$, $Bi_2S_3$, CdS, $Cu_xS$, $FeS_2$, ZnS, PbS, SnS, $In_2S_3$, NiS, CoS, MnS, CdZnS, CdPbS, $CuBiS_2$, $CuInS_2$, etc.) may be crystallized.

In addition to varying the precursor solutions which are deposited upon the substrate to vary the material or materials of the resulting micro structure, the configuration of the micro structure may also be varied by varying various process parameters. For example, the frequency at which the microwaves are applied and the microwave power level may be varied. The drop size as well as the concentration of the solute in the precursor solution may also be varied. The viscosity of the solution may be varied to influence the complexity of the crystals being formed. In particular, increasing the viscosity of the solution (i.e., the solvent in which the solute is dissolved) increases the complexity of the crystals. One example of a more complex crystal is a snowflake crystal. The characteristics of the substrate may also be varied to control wetting (adsorption) and/or absorption of the precursor solution. In addition, surfaces of the substrate may also be pretreated to control the resulting morphology or configuration of the micro structure. Examples of potential surface pretreatments include rubbing, ion beam or electron beam treatment or imprinting.

FIGS. 7-9 illustrate a few examples of the irradiation of precursor solutions while varying process parameters. FIGS. 7a-7f are optical micrographs illustrating the irradiation of a $Na_2SeSO_3$ precursor solution for differing time periods. In particular the precursor solution is initially prepared by combining $Na_2SO_3$ and Se at 90 degrees Celsius for a period of one hour. The $Na_2SeSO_3$ liquid solution is printed upon a substrate using a HP INK-JET PRINTER MODEL-DESK JET 1220C. Thereafter, the precursor solution was irradiated with microwaves having a power of 1580 W and a frequency of 2450 MHz. FIG. 7a illustrates the formation of crystals after the solution has been irradiated for 20 seconds to form micro structure 422. FIG. 7b illustrates the same solution irradiated by the microwaves for a period of 30 seconds to form micro structure 422'. FIG. 7c illustrates the same solution irradiated by the microwaves for a period of 40 seconds to form micro structure 422". FIG. 7d illustrates the same solution irradiated by the microwaves for a period of 50 seconds to form micro structure 422'". FIG. 7e illustrates the solution after it has been irradiated for a period of 1 minute to form micro structure 422"". FIG. 7f illustrates the solution after it has been irradiated for a period of 3 minutes to form micro structure 422""'. As shown by FIG. 7a-7f, the configuration of the crystals forming the micro structure may be controlled and varied by controlling the amount of time in which the precursor solution is irradiated.

Figure 8A:
FIGS. 8a-8c are optical micrographs of crystalline micro structures formed by irradiating the third solution printed upon a substrate at differing resolutions according to one exemplary embodiment.
Figure 8B:
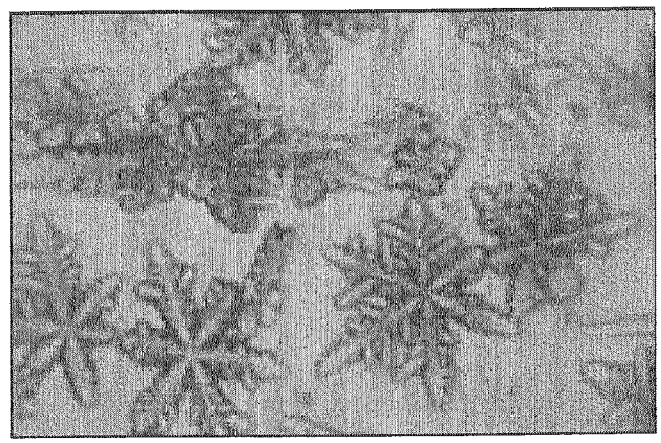
Figure 8C:
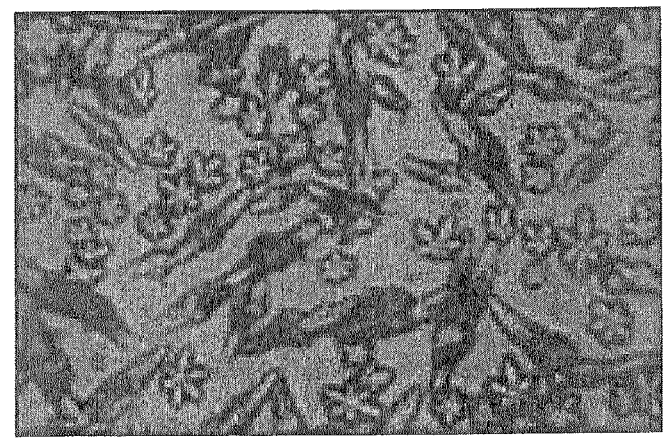

FIGS. 8a, 8b and 8c illustrate the same $Na_2SeSO_3$ liquid precursor solution after it has been irradiated for a period of 2 minutes by microwaves having a power of 1580 W and a frequency of 2450 MHz. However, the precursor solution is printed upon the substrate with varying resolutions. FIG. 8a illustrates the precursor solution deposited using a "draft" resolution mode for the printer and irradiated to form micro structure 522. FIG. 8b illustrates the precursor solution which has been deposited using a "normal" printer resolution mode for the printer and irradiated to form micro structure 522'. FIG. 8c illustrates the precursor solution deposited by the printer at the "best" resolution mode and irradiated to form micro structure 522". As shown by FIGS. 8a-8c, increasing the resolution (i.e. density) from "draft" to "normal" to "best" modes using the HP INK-JET PRINTER MODEL-DESK JET 1220C results in a greater degree of interconnections between the individual crystals of the micro structure.

In a particular example described, the "draft," "normal," and "best" modes relate to settings of an inkjet printer utilizing a HP 45 Black Inkjet Print Cartridge (51645A). In the "draft" mode, the quantity of solution deposited is approximately fifty percent of that which is normally deposited using a "normal" or "best" mode. A "draft" mode typically involves a single pass of printing. A "normal" mode results in about twice the volume of solution being deposited as compared to the "draft" mode. Depending upon an actual printer model, the "normal" mode generally involves two to three passes while the substrate removes one-half to one-third of the swath height between the passes, respectively. In the "best" mode, approximately the same quantity of solution is deposited as the "normal" mode. However, depending upon the actual printer model, the "best" mode involves six to ten passes. During each pass, 1/6 to 1/10 of the solution will be deposited upon the medium with each pass. The substrate is moved 1/6 to 1/10 of the swath height between the print passes, respectively. Differences between the "draft" mode and the "normal" or "best" modes are due to the quantity of solution or fluid being deposited. Differences between the "normal" and "best" modes result from either the buildup of thin versus thick layers and the dry-time between layers or variations in film quantity of (more passes gives more randomization of non-ideal dropweight and directionality). In other embodiments, the precursor solution may be deposited by a printer having greater or fewer number of such printing modes or by a printer having different printing modes.

Figure 9A:
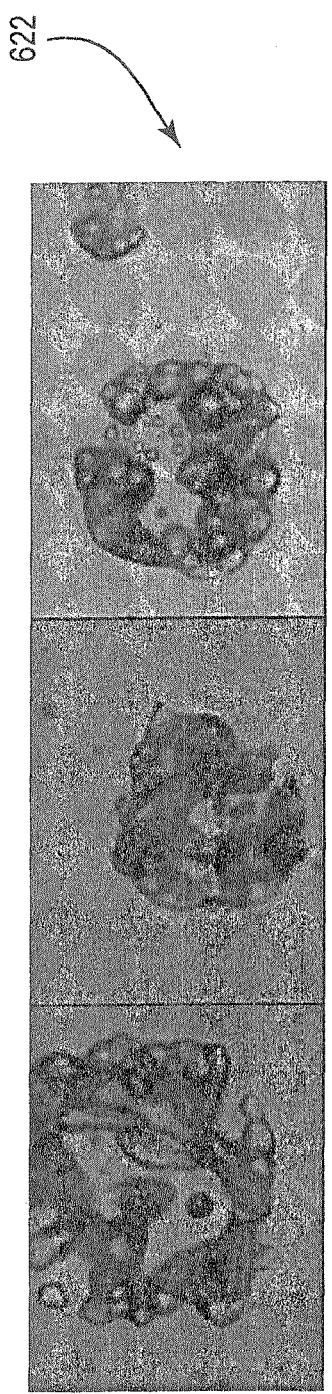
FIGS. 9a and 9b are optical micrographs of crystalline micro structures formed by irradiating the third solution deposited on different substrates according to one exemplary embodiment.
Figure 9B:
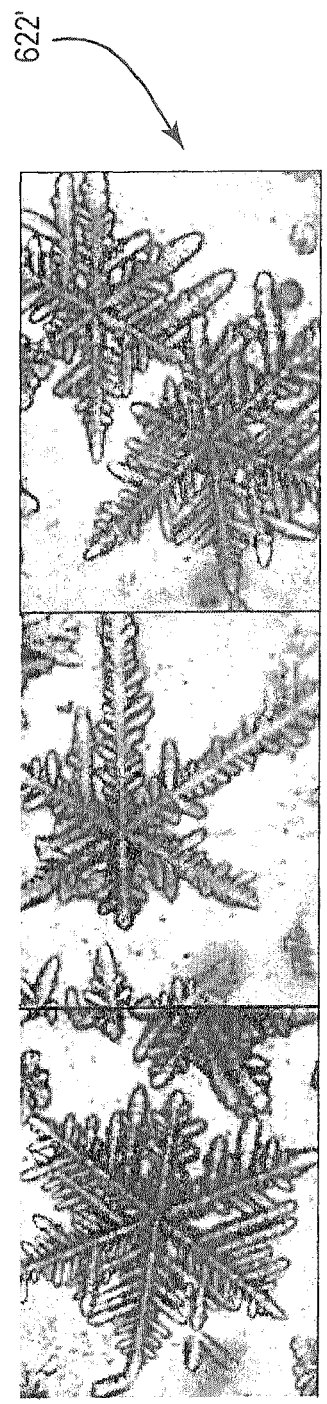

FIGS. 9a and 9b are optical micrographs illustrating the 1M $Na_2SeSO_3$ liquid precursor solution being irradiated with microwaves having a power of 1580 W and a frequency of 2450 MHz for a period of 2 minutes. The micro structure 622 shown in FIG. 9a is formed by irradiating the precursor solution deposited upon a first substrate while the micro structure 622' shown in FIG. 9b is formed by irradiating the precursor solution deposited upon a second distinct substrate. In the particular example shown, micro structure 622 is formed from the $Na_2SeSO_3$ precursor solution deposited upon an inkjet transparency substrate while the microstructure 622' shown in FIG. 9b is formed by irradiating the precursor solution while the $Na_2SeSO_3$ precursor solution is upon a laser transparency. The porosity of the inkjet transparency, as compared to the smooth laser transparency, is likely the reason for the difference.

Figure 10A:
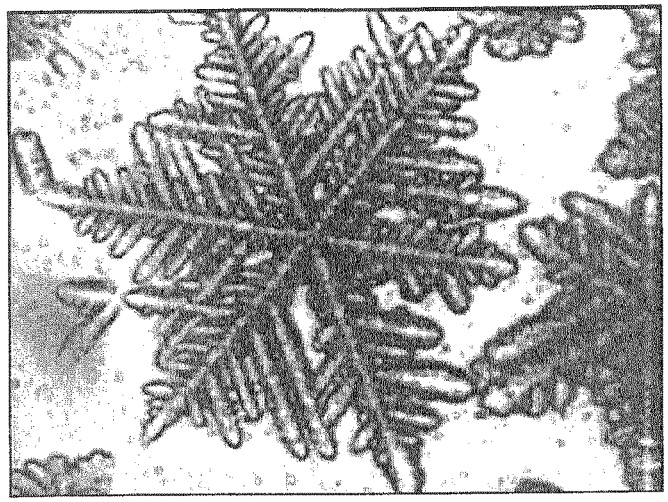
FIG. 10a is an optical micrograph of a six-fold snowflake micro structure formed by irradiating the third solution according to one exemplary embodiment.
Figure 10B:
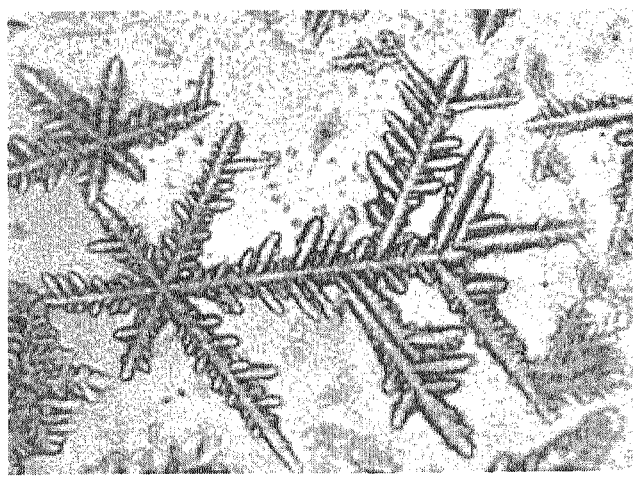
FIG. 10b is an optical micrograph of an asymmetric snowflake crystalline micro structure formed by irradiating the third solution according to one exemplary embodiment.
Figure 10C:
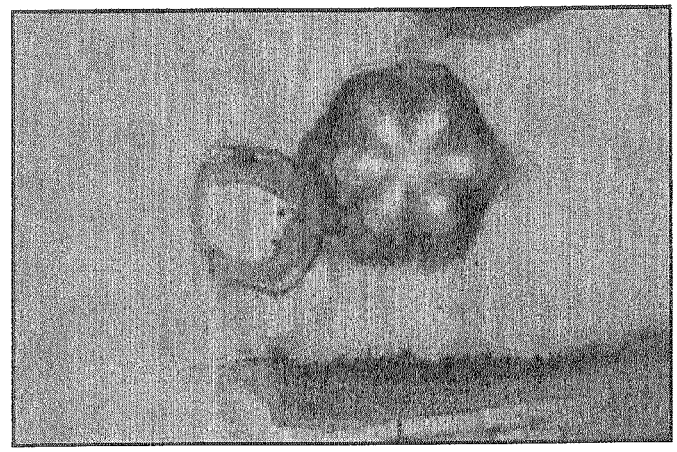
FIG. 10c is an optical micrograph of a hexagonal plate crystalline micro structure from irradiating the third solution according to one exemplary embodiment.
Figure 10D:
FIG. 10d is an optical micrograph of a needle-like eye-shaped crystalline micro structure formed by irradiating the third solution with microwaves according to one exemplary embodiment.
Figure 10E:
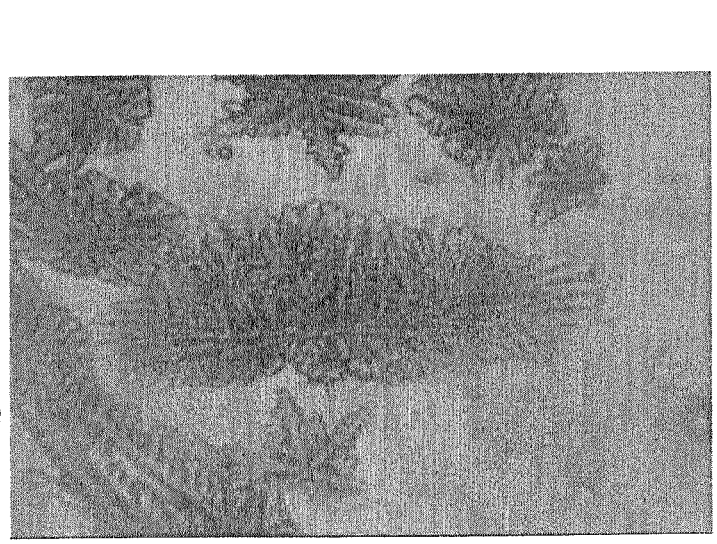
FIG. 10e is an optical micrograph of a dense branching crystalline micro structure formed by irradiating the third solution with microwaves according to one exemplary embodiment.
Figure 10F:
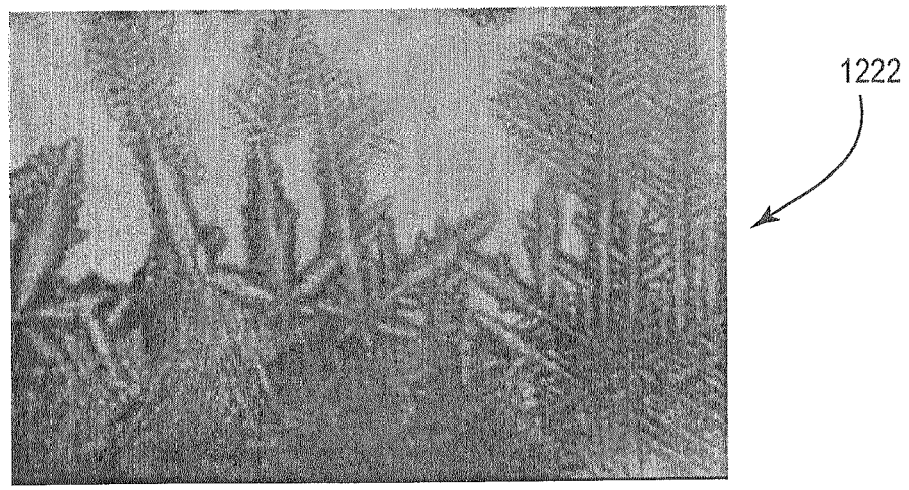
FIG. 10f is an optical micrograph of a tree-like dendritic crystalline micro structure formed by irradiating the third solution with microwaves according to one exemplary embodiment.
Figure 10G:
FIG. 10g is an optical micrograph of a long fiber crystalline micro structure formed by irradiating the third solution With microwaves according to one exemplary embodiment.

FIGS. 10a-10g illustrate varying crystal morphologies that may be created by irradiating a liquid precursor solution with microwaves. FIGS. 10a-10g illustrate various crystal morphologies achieved by printing a printing the $Na_2SeSO_3$ liquid precursor solution described above with respect to FIGS. 7-9 using an HP INK-JET PRINTER MODEL-DESK JET printer and irradiating the solution with 2450 MHz microwave radiation in a 1580 W microwave oven. The microwaves result in a rapid heat gain which creates a far from equilibrium condition suitable for dendrite crystallization. FIG. 10a is an optical micrograph illustrating a six-fold snowflake micro crystal 722 having a characteristic color of elemental amorphous selenium. Crystal 722 was formed by printing the precursor solution in the "normal" mode and irradiating the solution with the microwaves for two minutes. FIG. 10b is an optical micrograph illustrating highly asymmetric snowflakes 822 which resulted from non-uniform temperature and distribution of the $Na_2SeSO_3$ precursor solution. By varying conditions such as inkjet resolution, microwave conditions and types of substrate, other crystal morphologies were achieved including hexagonal plate 922 (shown in FIG. 10c), needle-like eye-shaped crystals 1022 (shown in FIG. 10d), dense branching crystals 1122 (shown in FIG. 10e), tree-like dendritic crystals 1222 (shown in FIG. 10f) and long fiber crystals 1322 (shown in FIG. 10g). In particular, crystals 922 were formed by printing the precursor solution in the "normal" mode and irradiating the solution with the microwaves for 20 seconds. Crystals 1022 were formed by printing the precursor solution in the "normal" mode and irradiating the solution with the microwaves for 30 seconds. Crystals 1122 were formed by printing the precursor solution in the "draft" mode and irradiating the solution for 2 minutes. Crystals 1222 and 1322 were formed by printing the precursor solution in the "best" mode and irradiating the solution for two minutes. Crystals 1222 and 1322 were formed at different regions of a substrate such that microwave field variations result in different crystal formations.

Figure 11A:
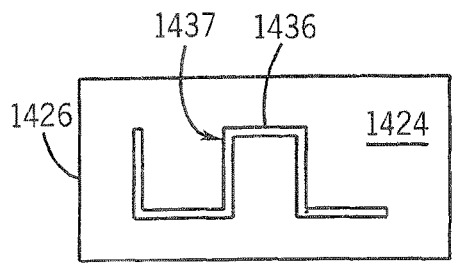
FIG. 11a is a top plan view of an embodiment of a liquid precursor solution deposited upon an embodiment of a substrate in a pattern according to one exemplary embodiment.
Figure 11B:
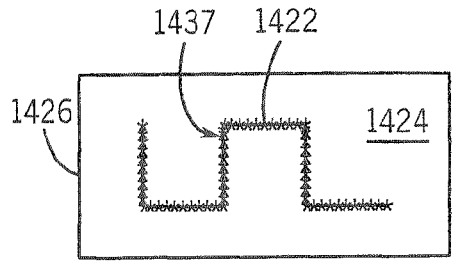
FIG. 11b is a top plan view of a crystalline micro structure formed upon the substrate of FIG. 11a by irradiating the solution of FIG. 11a with microwaves according to one exemplary embodiment.
Figure 11C:
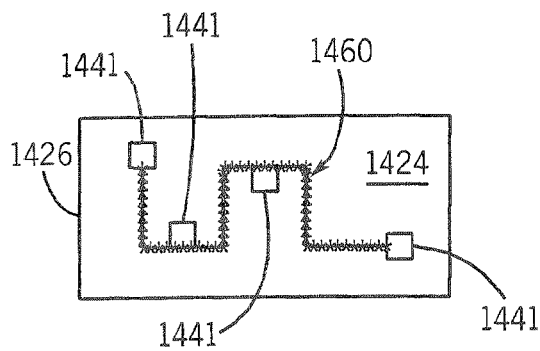
FIG. 11c is top plan view of an embodiment of an electronic circuit formed upon the substrate of FIG. 11b including the micro structure of FIG. 11b according to one exemplary embodiment.

The various micro structures including different crystallized solutes and having different crystal morphologies may be utilized in a variety of applications. FIGS. 11a-11c schematically illustrate the formation of an electronic circuit 1460 upon substrate 1426. Substrate 1426 comprises a dielectric material such as silicon. In other embodiments, substrate 1426 may be formed from other materials which may be flexible in nature.

Circuit 1460 is formed by system 20 shown in FIG. 1. As shown by FIG. 11a, controller 35 (shown in FIG. 1) generates control signals which cause transport 34 to position substrate 1426 proximate to deposition station 30. Deposition station 30, which includes one or more ink-jet print heads, is selectively actuated in response to control signals from controller 35 as transport 34 moves substrate 1426 relative to the ink-jet print heads and/or as the ink-jet print heads are moved relative to substrate 1426 to deposit a liquid precursor solution 1436 in a precisely controlled pattern 1437 (shown in FIG. 11*a*) upon surface 1424.

As shown by FIG. 11*b*, once pattern 1437 has been completed, controller 35 generates control signals causing transport 34 to move substrate 1426 proximate to irradiation station 32. Irradiation station 32 (shown in FIG. 1) applies microwaves to pattern 1437 of precursor solution 1436 to crystallize the solute upon surface 1424. Precursor solution 1436 is configured such that the solute being crystallized upon surface 1424 of substrate 1426 is electrically conductive. The process parameters (the microwave power and frequency), the solution concentration, the printer resolution, the solution viscosity and the like are chosen such that the crystallized solute forms a continuous thin film of non-equilibrium two-dimensional crystals along pattern 1437. In one embodiment, the process parameters are chosen such that crystallized solute forms narrow interconnected two-dimensional dendritic crystals such as long fiber crystals. Examples of precursor solutions which may be printed upon substrate 1424 which result in electrically conductive micro structures along pattern 1437 include: $HAuCl_4$+tri-sodium citrate+$H_2O$; $AgNO_3$+$H_2O$; $AgNO_3$+$H_2O$+EG; $AgNO_3$+EG; $AgNO_3$+$H_2O$+EG+Hydrazine; $AgNO_3$+$H_2O$+DMF. Each of the aforementioned solutions results in a crystallized micro structure of silver or gold. The remaining elements of the solution, after irradiation, are either washable or vaporizable.

As shown by FIG. 11*c*, after pattern 1437 of micro structure 1422 has been formed, electronic components 1441 (schematically shown) are mounted to substrate 1426, wherein power or electrical signals between such components 1441 are transmitted through pattern 1437 or micro structure 1422. As a result, micro structure 1422 functions as electrical traces on an electrical device such as a circuit board. In particular embodiments, electronic components 1441 may be mounted to substrate 1426 prior to the deposition of the precursor solution upon substrate 1424 or after deposition of precursor solution 1436 but prior to irradiation of precursor solution 1436. Because precursor solution 1436 may be precisely patterned upon substrate 1424, the complexity and compactness of circuit 1460 is enhanced.

Figure 12A:
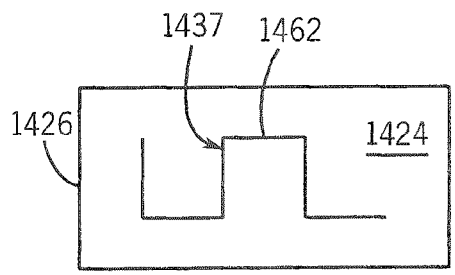
FIG. 12a is a top plan view of an exemplary patterning agent deposited upon a substrate according to one exemplary embodiment.
Figure 12B:
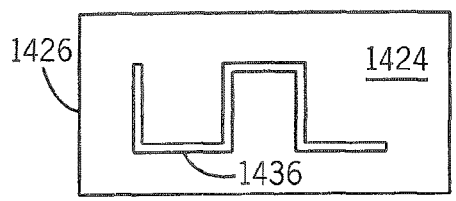
FIG. 12b is a top plan view of an embodiment of a liquid precursor solution deposited upon the substrate of FIG. 12a according to one exemplary embodiment.
Figure 12C:
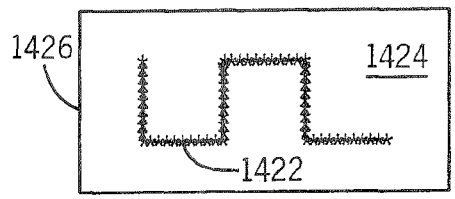
FIG. 12c is a top plan view of an exemplary crystalline micro structure upon the substrate of FIG. 12b formed by irradiating the solution of FIG. 12b with microwaves according to one exemplary embodiment.
Figure 12D:
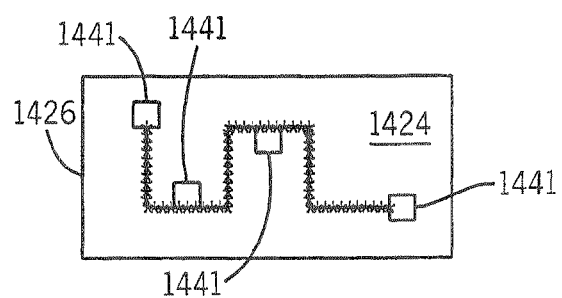
FIG. 12d is a top plan view of an embodiment of an electronic circuit formed upon the substrate of FIG. 12c including the micro structure of FIG. 12c according to one exemplary embodiment.

FIGS. 12*a*-12*d* schematically illustrate the same general process illustrated in FIGS. 11*a*-11*c* except that the process shown in FIGS. 12*a*-12*d* includes the additional step of depositing a patterning agent 1462 upon surface 1424 (as shown in FIG. 12*a*) to assist in the patterning of liquid precursor solution 1436. Patterning agent 1462 comprises a material or agent configured to either attract or repel precursor solution 1436 such that precursor solution 1436 flows into the pattern of the patterning agent 1462 or flows to a negative image of the patterning agent 1462. In one embodiment, patterning agent 1462 is configured so as to have a surface energy (i.e., surface tension) (Dynes/cm) relative to the surface energy or surface tension of precursor solution 1436 so as to attract or repel precursor solution 1436. In the embodiment shown, patterning agent 1462 comprises a surfactant which attracts precursor solution 1436. Alternatively, patterning agent 1462 may comprise a surfactor. In other embodiments, patterning agent 1462 may comprise other materials deposited or applied to surface 1424. In still other embodiments, surface 1424 may be treated using a patterning agent which alters the surface 1424 such that portions of surface 1424 attract or repel precursor solution 1436.

The use of patterning agent 1462 may enable either more precise positioning of precursor solution 1436 utilizing an inkjet printhead provided at deposition station 30 (shown in FIG. 1). The use of patterning agent 1462 may also enable the use of alternative fluid deposition methods at deposition station 30 such as spin coating, dip coating, condensation, chemical solution deposition, spray and transfer methods, and the like, wherein excess precursor solution 1436 is not held by agent 1462 and is removed from substrate 1426.

Figure 13A:
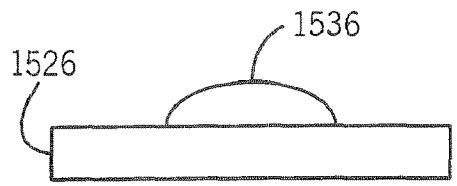
FIG. 13a is a side elevational view schematically illustrating an embodiment of a liquid precursor solution upon the substrate according to one exemplary embodiment.
Figure 13B:
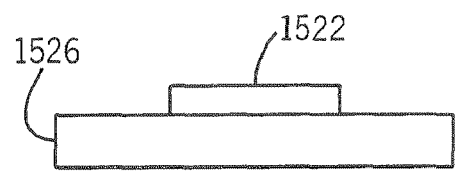
FIG. 13b is a side elevational view of the crystalline micro structure upon the substrate of FIG. 13a formed by irradiating the solution with microwaves according to one exemplary embodiment.
Figure 13C:
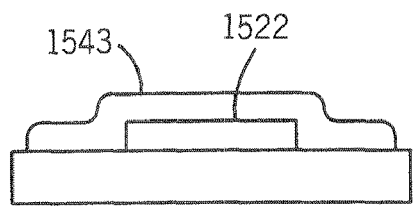
FIG. 13c is a sectional view schematically illustrating the deposition of an embodiment of a layer of material over the micro structure of FIG. 13b according to one exemplary embodiment.
Figure 13D:
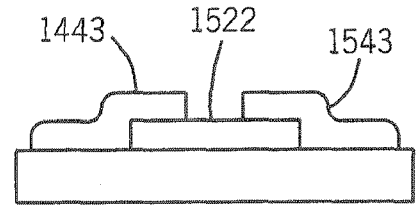
FIG. 13d is a sectional view schematically illustrating removal of a portion of the layer of material of FIG. 13c to expose the micro structure according to one exemplary embodiment.
Figure 13E:
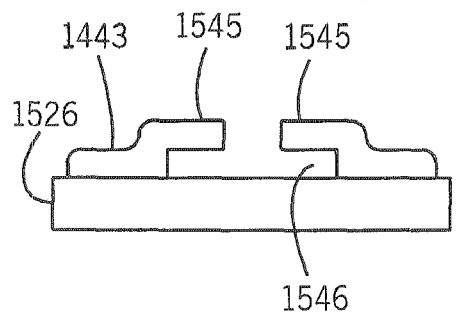
FIG. 13e is a sectional view schematically illustrating removal of the micro structure of FIG. 13d according to one exemplary embodiment.

FIGS. 13*a*-13*e* schematically illustrate the formation and use of a micro structure 1522 as a sacrificial structure. In particular, a precursor solution 1536 is initially deposited upon substrate 1526 by an inkjet printer or by other deposition techniques. After being irradiated with microwaves, the solute of precursor solution 1536 crystallizes to form a two-dimensional non-equilibrium crystals that form thin film micro structure 1522 upon substrate 1526. Thereafter, a secondary layer 1543 of material is deposited over and upon substrate 1526 and micro structure 1522. Layer 1543 may be deposited by sputtering, spin coating or other deposition techniques. As shown by FIG. 13*d*, a portion of layer 1543 is removed to expose micro structure 1522. The portion of 1543 may be removed by wet etching, dry etching or other material removal techniques. As indicated by FIG. 13*e*, micro structure 1522 is then removed using a material removal technique such as chemical etching, dry etching and the like, leaving a pair of cantilevered extensions 1545 extending over a cavity 1546 formed by sacrificed micro structure 1522. Because micro structure 1522 is formed by applying microwaves to a precursor solution 1536 to form a thin but largely continuous thin film layer of crystals, cavity 1546 is also generally continuous and thin. Micro structure 1522 enables micro electromechanical (MEMs) devices to be formed with thinner, potentially continuous, cavities by sacrificing such micro structures.

Figure 14A:
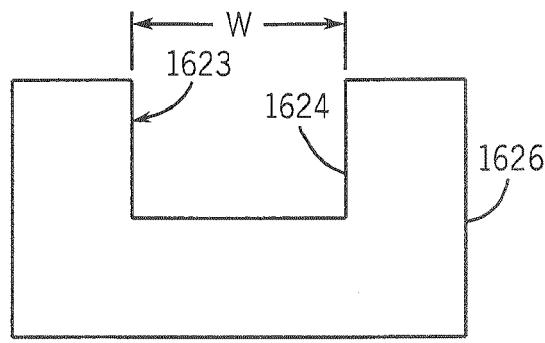
FIG. 14a is a sectional view schematically illustrating an embodiment of a substrate including an embodiment of a channel according to one exemplary embodiment.
Figure 14B:
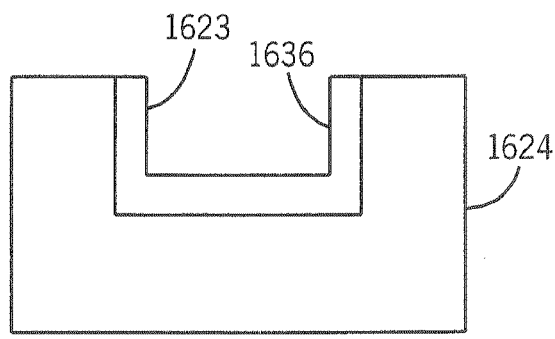
FIG. 14b is a sectional view schematically illustrating the deposition of an embodiment of a liquid precursor solution in the micro channel according to one exemplary embodiment.
Figure 14C:
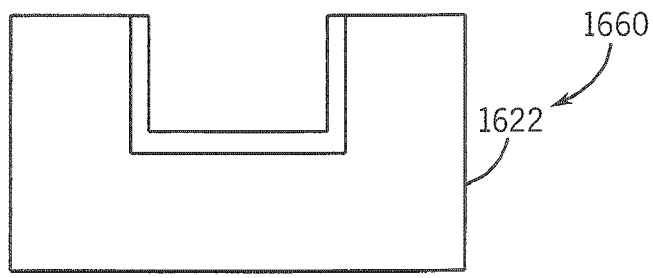
FIG. 14c is a sectional view schematically illustrating a crystalline micro structure within the channel formed by irradiating the solution of FIG. 14b with microwaves according to one exemplary embodiment.

FIGS. 14*a*, 14*b* and 14*c* illustrate a process for forming a micro fluidic device 1660. As shown by FIG. 14*a*, a channel 1623 having an inner surface 1624 is formed within substrate 1626. As shown by FIG. 14*b*, a layer of a precursor solution 1636 is deposited upon surface 1624 and within channel 1623. In one particular embodiment, the layer of precursor solution is deposited within channel 1623 utilizing one or more ink-jet print heads. In one particular embodiment, channel 1623 has a width W of less than about 100 micrometers.

As shown by FIG. 14*c*, precursor solution 1636 is subjected to microwave treatment by being exposed to microwaves which crystallize the solute within solution 1636 to form micro structure 1622 which generally comprises a continuous thin film of two-dimensional non-equilibrium two-dimensional crystals.

During use of device 1660, the fluid flows within channel 1623 while contacting micro structure 1622. Micro structure 1622, acting as a catalyst, causes or accelerates a chemical change in the fluid flowing through channel 1623. Because micro structure 1622 generally comprises a continuous thin film layer of two-dimensional crystals, micro structure 1622 provides channel 1623 with a relatively large surface area of catalytic material while having a relatively small thickness so as to not substantially reduce the cross sectional area of channel 1623, enabling micro fluidic device 1660 to be smaller in size. In one particular embodiment, precursor solution 1636 and the process parameters applied during irradiation of precursor solution 1636 are chosen such that micro structure 1622 includes snowflake crystals which are relatively thin but have a relatively large surface area. Examples of solutions from which micro structure 1622 may be formed include: $Mg(NO_3)_2$, $Zr(NO_3)_4$, $Ce(NO_3)_3$, $Fe(NO_3)_3$, chlorides, sulphates and other species which result in a variety of catalyst supports MgO, $ZrO_2$, $CeO_2$, $Fe_2O_3$ and the like. In addition some titanium compounds (e.g. titanium oxalate, titanium bromide) and aluminum compounds (e.g. aluminum nitrate, aluminum chloride) may be dissolved in water, alcohol and/or other solvents and irradiated to form $TiO_2$ and $Al_2O_3$, respectively.

Figure 15A:
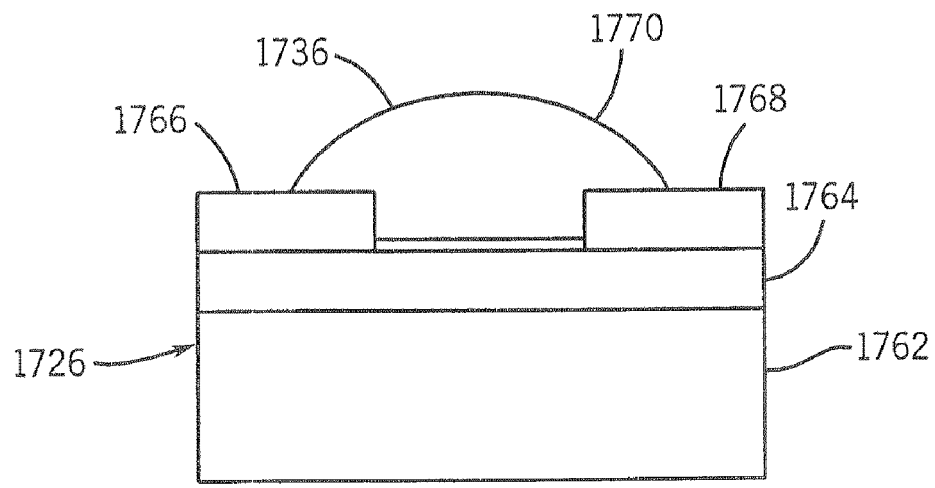
FIG. 15a is a sectional view of an embodiment of a liquid precursor solution deposited upon an embodiment of a transistor substrate according to one exemplary embodiment.
Figure 15B:
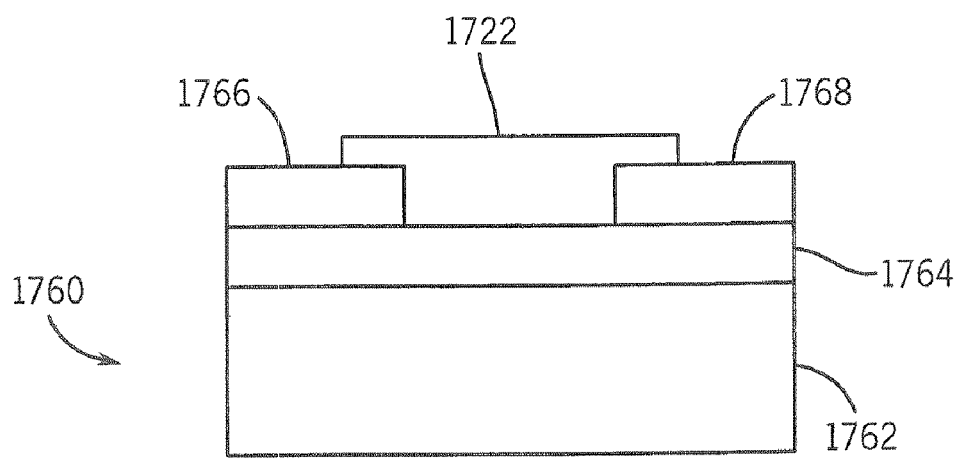
FIG. 15b is a sectional view of a crystalline micro structure formed upon the transistor substrate of FIG. 15a by irradiating the solution of FIG. 15a with microwaves according to one exemplary embodiment.

FIGS. 15a and 15b schematically illustrate the fabrication of a transistor 1760. In particular, FIGS. 15a and 15b illustrate the fabrication of a bottom gate thin film transistor 1760. As shown by FIG. 15a, a precursor solution 1736 is deposited upon a transistor substrate 1726. Transistor substrate 1726 includes an electrically conductive gate electrode or layer 1762, a gate insulator layer 1764, a source electrode 1766 and a drain electrode 1768. Source electrode 1766 and drain electrode 1768 are separated from gate 1762 by gate insulator layer 1764 and are spaced from one another by a gap 1770. Precursor solution 1736 is deposited within gap 1770 so as to bridge between source electrode 1766 and drain electrode 1768.

As shown by FIG. 15b, precursor solution 1736 is exposed to microwave radiation which causes solute within precursor solution 1736 to crystallize and form micro structure 1722 which comprises a continuous thin film of two-dimensional non-equilibrium semiconductor crystals. Micro structure 1722 has a thickness T of less than about 1 micrometer. As a result, the overall thickness of transistor 1760 is relatively small. Moreover, because precursor solution 1736 may be precisely deposited using an ink-jet printhead, the overall size of transistor 1760 may be further reduced. Examples of precursor solution 1736 that may be used in the fabrication of transistor 1760 include: $Zn(NO_3)_2$; $Cu(NO_3)$; Selenourea, $CdCl_2+Na_2SeSO_3+H_2O$; $Cd(NO_3)_2+Na_2S+2H_2O$; $CuSO_4+CH_3COONa$(Sodium Acetate)$+C_6H_{15}NO_3$(TEA)$+NH_4OH+CH_4N_2S$(Thiourea)$+H_2O$. Examples of semiconductor crystals forming micro structure 1722 include semiconducting oxides such as ZnO and CuO. Other semiconducting crystals that may be used include Se, CdSe, CdS, and $Cu_xS$.

Figure 16:
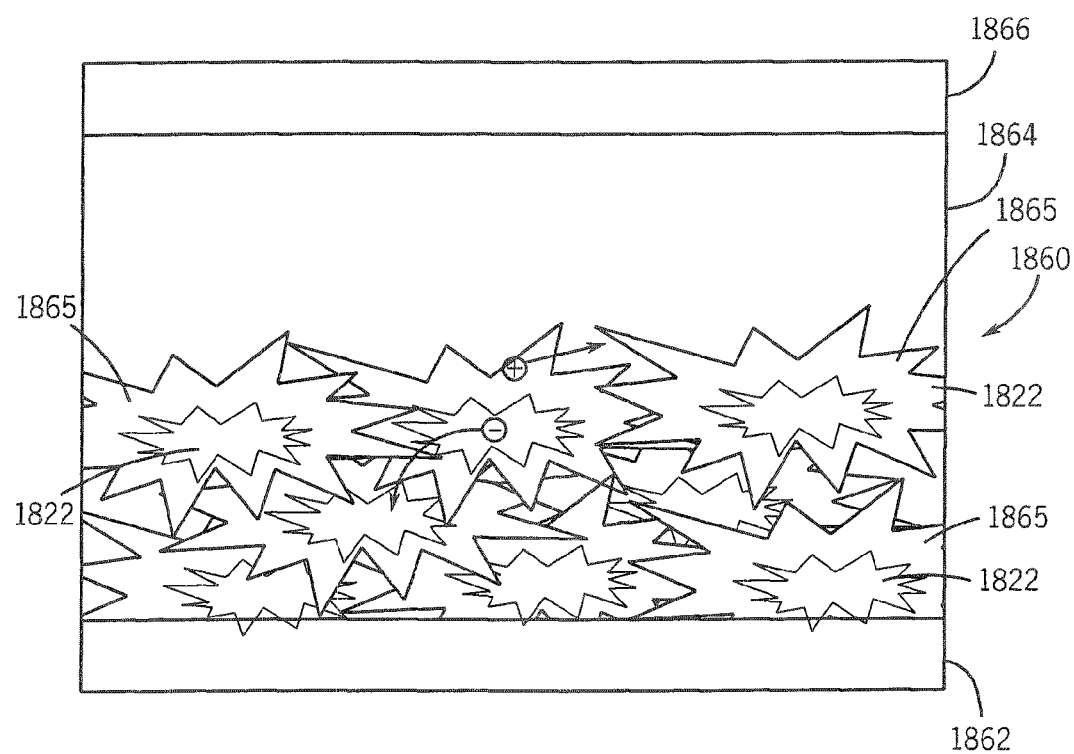
FIG. 16 is a sectional view of an embodiment of a solar cell according to one exemplary embodiment.

FIG. 16 schematically illustrates fabrication of solar cell 1860. Solar cell 1860 includes transparent cathode layer 1862, p-type micro structure 1822, conducting polymer 1864, n-type donor conducting material 1865 and anode layer 1866. Micro structure 1822 is generally formed by initially depositing a precursor solution upon transparent cathode 1862 and thereafter irradiating the precursor solution with microwaves. Micro structure 1822 generally includes one or more layers of thin film two-dimensional non-equilibrium crystals. In one embodiment, micro structure 1822 comprises a p-type inorganic material Examples of crystallized solute which forms micro structure 22 include Ag, Au, Pd, Pt, Oxides (e.g. AgO, $Al_2O_3$, CdO, CuO, $Fe_2O_3$, $Fe_3O_4$, $In_2O_3$, MgO, $Mn_2O_3$, $MnO_2$, NiO, $PbO_2$, $SnO2$, $TiO_2$, $Y_2O_3$, ZnO, $ZrO_2$, $BaTiO_3$, $Cd_2SnO_4$, CdZnO, $CuAlO_2$, $MgAl_2O_4$, $YBaCU_3O_7$, $Mn_xZr_{1-x}Fe_2O_4$, $CuFe_2O_4$, Selenides (e.g. Se, CdSe, $Bi_2Se_3$, CoSe, HgSe, PbSe, SnSe, $Sb_2Se_3$, ZnSe, CdZnSe, PbHgSe, $CuInSe_2$, etc.) and Sulfides (e.g. $Ag_2S$, $Bi_2S_3$, CdS, $Cu_xS$, $FeS_2$, ZnS, PbS, SnS, $In_2S_3$, NiS, CoS, MnS, CdZnS, CdPbS, $CuBiS_2$, $CuInS_2$, etc.). In other embodiments, the materials of structure 22 may be doped.

The donor conducting material 1864 comprises a material which is deposited upon micro structure 1822. Donor conducting material 1865 comprises portions of material 1864 which are adsorbed about the layers of crystals forming micro structure 1822 and which donate electrons. Examples of a conducting polymer include polyanilines and/or polythiophenes. Anode layer 1866 comprises an electrically conductive layer in electrical contact with donor material 1864.

In operation, photons pass through transparent cathode layer 1862 and upon micro structure 1822 such that micro structure 1822 and donor layer 1864 create an electric field between cathode layer 1862 and anode layer 1866. Cathode layer 1862 and anode layer 1866 serve as part of an external current path for the generation of electrical current. In this arrangement, micro structure 1822 provides a large surface area due to its crystalline nature which provides many locations for transfer of electrons or charge. In addition, because micro structure 1822 is extremely thin and may be inexpensively formed, the fabrication costs of solar cell 1860 are reduced.

In summary, the process of forming a structure by depositing a solution and irradiating the solution to crystallize a solute provides several benefits. First, the irradiation of the solution with microwaves enables a continuous network of crystalline materials to be formed rather than isolated crystalline structures. The continuous network of crystalline materials form interconnected structures which assist in the conduction of electrons and/or holes in the case of semiconductors and/or conductors. Second, the irradiation of the solution with microwaves greatly enhances film formation kinetics to create unique structures. Third, the crystallization of the solute is fast and cost effective while possibly reducing exposure of the substrate or structures upon the substrate to high temperatures. As a result, low temperature substrates, such as polymers, may be utilized as a substrate. Moreover, in those applications wherein the solution is deposited upon the substrate using an ink-jet printer, the location and resolution of the precursor solution being deposited upon the substrate may be precisely controlled and patterned. As a result, the size, thickness and location of the resulting crystal micro structure may also be precisely controlled.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. A structure comprising:
   a surface;
   a non-equilibrium two-dimensional semiconductor micro structure on the surface, wherein the non-equilibrium two-dimensional semiconductor micro structure comprises a plurality of interconnected non-equilibrium two-dimensional crystals forming a network of crystalline material, wherein the micro structure is selected from a group of structures including:
   dendrite snow-flake crystal, tree-like dendrite crystal, needle-like eye-shaped crystal and hexagonal plate; and
   an electrical source configured to transmit electrical charge across the non-equilibrium two-dimensional semiconductor micro structure on the surface.

2. The structure of claim 1, wherein the surface is a polymer.

3. The structure of claim 1, wherein the surface is a polymer selected from a group including polydimethylsiloxane (PDMS), polyethylene teraphalate (PET), and glass.

4. The structure of claim 1, wherein the micro structure is a continuous film.

5. The structure of claim 1, wherein the structure has a thickness of less than 200 microns.

6. The structure of claim 1, wherein the micro structure has a thickness of a single crystal.

7. The structure of claim 1 including:
a source electrode;
a drain electrode, wherein the micro structure connects the source electrode and the drain electrode;
a gate electrode opposite the micro structure; and
an insulator between the gate electrode, the source electrode and the drain electrode, wherein the insulator provides the surface.

8. The structure of claim 1, wherein the micro structure has a snowflake shape.

9. The structure of claim 1, wherein the structure includes a material selected from a group of materials consisting of ZnO, CuO, Se, CdSe, CdS and $CU_xS$.

10. The structure of claim 1, wherein the network of crystalline material has a thickness of a single crystal.

11. The structure of claim 1, wherein each of the interconnected non-equilibrium two-dimensional crystals has a dendrite in contact with a dendrite of an adjacent one of the interconnected non-equilibrium two-dimensional crystals.

12. A transistor comprising:
a source electrode;
a drain electrode;
a gate electrode;
a polymeric insulator between the gate electrode, the source electrode and the drain electrode; and
a non-equilibrium two-dimensional semiconductor micro structure on the insulator and continuously extending between the source electrode and the drain electrode to connect the source electrode and the drain electrode, wherein the non-equilibrium two-dimensional semiconductor micro structure comprises a plurality of interconnected non-equilibrium two-dimensional crystals forming a network of crystalline material.

13. The transistor of claim 12, wherein the micro structure is selected from a group of structures including:
dendrite snow-flake crystal, tree-like dendrite crystal, needle-like eye-shaped crystal, hexagonal plate and long fiber.

14. The transistor of claim 12, wherein the micro structure has a thickness of a single crystal.

15. The transistor of claim 12, wherein the structure includes a material selected from a group of materials consisting of ZnO, CuO, Se, CdSe, CdS and $CU_xS$.

16. The transistor of claim 12, wherein the network of crystalline material has a thickness of a single crystal.

17. The transistor of claim 12, wherein each of the interconnected non-equilibrium two-dimensional crystals has a dendrite in contact with a dendrite of an adjacent one of the interconnected non-equilibrium two-dimensional crystals.

18. The transistor of claim 12, wherein each of the interconnected non-equilibrium two-dimensional crystals has a snowflake shape.

19. A structure comprising:
a surface;
a microwave irradiated non-equilibrium two-dimensional semiconductor micro structure on the surface, wherein the non-equilibrium two-dimensional semiconductor micro structure comprises a plurality of interconnected non-equilibrium two-dimensional crystals forming a network of crystalline material; and
an electrical source configured to transmit electrical charge across the non-equilibrium two-dimensional semiconductor micro structure on the surface.

20. The structure of claim 19, wherein the micro structure is selected from a group of structures including:
dendrite snow-flake crystal, tree-like dendrite crystal, needle-like eye-shaped crystal and hexagonal plate.

* * * * *

UNITED STATES PATENT AND TRADEMARK OFFICE
CERTIFICATE OF CORRECTION

PATENT NO. : 8,143,616 B2  Page 1 of 1
APPLICATION NO. : 12/426955
DATED : March 27, 2012
INVENTOR(S) : Gregory S. Herman et al.

It is certified that error appears in the above-identified patent and that said Letters Patent is hereby corrected as shown below:

In column 14, line 67, in Claim 3, delete "teraphalate" and insert -- terephthalate --, therefor.

In column 15, line 19, in Claim 9, delete "$CU_xS$." and insert -- $Cu_xS$. --, therefor.

In column 16, line 12, in Claim 15, "$CU_xS$." and insert -- $Cu_xS$. --, therefor.

Signed and Sealed this
Eleventh Day of December, 2012

David J. Kappos
*Director of the United States Patent and Trademark Office*